(12) United States Patent
Knippels et al.

(10) Patent No.: US 8,569,712 B2
(45) Date of Patent: Oct. 29, 2013

(54) BEAM BLANKER FOR INTERRUPTING A BEAM OF CHARGED PARTICLES

(75) Inventors: Guido Martinus Henricus Knippels, Schijndel (NL); Fredericus Bernardus Kiewiet, Eindhoven (NL); Hendrik Nicolaas Slingerland, Venlo (NL); Pieter Kruit, Delft (NL); Benjamin John Cook, The Hague (NL); Jacques Nonhebel, Delft (NL)

(73) Assignee: FEI Company, Hillsboro, OR (US)

( * ) Notice: Subject to any disclaimer, the term of this patent is extended or adjusted under 35 U.S.C. 154(b) by 101 days.

(21) Appl. No.: 13/269,385

(22) Filed: Oct. 7, 2011

(65) Prior Publication Data

US 2012/0261586 A1  Oct. 18, 2012

Related U.S. Application Data (60) Provisional application No. 61/390,729, filed on Oct. 7, 2010.

(51) Int. Cl.
*G21K 1/08* (2006.01)

(52) U.S. Cl.
USPC .... 250/396 R; 250/306; 250/307; 250/492.1; 250/492.3

(58) Field of Classification Search
USPC ........... 250/306, 307, 310, 311, 492.1–492.3, 250/396 R
See application file for complete search history.

(56) References Cited

U.S. PATENT DOCUMENTS

| | | | |
|---|---|---|---|
| 4,445,041 A | 4/1984 | Kelly et al. | |
| 6,218,664 B1 | 4/2001 | Krans et al. | |
| 7,154,091 B2 | 12/2006 | Zewail et al. | |
| 7,569,841 B2 | 8/2009 | Hill et al. | |
| 8,101,928 B2 | 1/2012 | Hill et al. | |
| 8,314,409 B2 | 11/2012 | Miller et al. | |
| 2009/0236521 A1* | 9/2009 | Zewail et al. | 250/307 |

FOREIGN PATENT DOCUMENTS

| | | |
|---|---|---|
| DE | 4034421 | 6/1991 |
| JP | 2010-192608 | 9/2010 |

OTHER PUBLICATIONS

Ura, et al ("Picosecond Pulse Stroboscopic Scanning Electron Microscope" J. Electron Microsc., vol. 27, No. 4, 247-252, 1978).*
Winkler, D., et al., "Blanking System for Electron-Beam Testing with Picosecond Time Resolution," Optik, Mar. 1, 1888, pp. 164-172, vol. 78, No. 4.

(Continued)

*Primary Examiner* — Michael Maskell
(74) *Attorney, Agent, or Firm* — Scheinberg & Associates, PC; Michael O. Scheinberg (57) ABSTRACT

The invention relates to an electrostatic beam blanker for a particle-optical apparatus, in which the blanker is used to generate a train of pulses with a fixed repetition rate. Such pulse trains with a sub-picosecond pulse length are for example used in the study of chemistry in the femtosecond scale.

The beam blanker according to the invention uses a resonant structure, as a result of which the voltage is amplified by the quality factor Q of the resonant structure. During each zero-crossing of the signal, thus twice per period of the resonant frequency, the beam is transmitted, and the beam is blanked during the rest of the time. In a preferred embodiment the resonant structure comprises a transmission line. Impedance matching of signal source and resonant structure may be performed by tuning stubs.

23 Claims, 4 Drawing Sheets

(56) References Cited

OTHER PUBLICATIONS

Ura, Katsumi, et al., "Picosecond Pulse Stroboscopic Scanning Electron Microscope," J. Electron Microsc., 1978, p. 247-252, vol. 27, No. 4.

Fugisawa, K., "General Treatment of Klystron Resonant Cavities," IRE Trans. on Microwave Theory and Techniques, Oct. 1958, pp. 344-358.

* cited by examiner

BEAM BLANKER FOR INTERRUPTING A BEAM OF CHARGED PARTICLES

This Application claims priority from U.S. Provisional Application 61/390,729, filed Oct. 7, 2010, which is hereby incorporated by reference.

BACKGROUND AND SUMMARY

The invention relates to a beam blanker for interrupting a beam of charged particles, the beam blanker showing an axis along which charged particles propagate before entering the beam blanker, the beam blanker comprising means for generating an electric field perpendicular to said axis, the electric field for deflecting the charged particles, and an aperture in a diaphragm, the aperture transmitting the beam when the beam is not interrupted and the diaphragm stopping the beam when the beam is interrupted.

Such a beam blanker is known from U.S. Pat. No. 4,445,041.

Beam blanking is used in for example charged particle instruments, such as Scanning Electron Microscopes, Transmission Electron Microscopes, Focused Ion Beam machines, and the like.

A well-known application is the use of a beam blanker for modulating the beam current in an Electron Beam Lithography System. In such a system a beam of energetic electrons is focused and scanned over a substrate, such as a semiconductor wafer covered with a resist layer. During this scanning the beam is blanked/unblanked, as a result of which part of the resist layer is irradiated by the electron beam and part of the resist layer is not exposed to electrons. Due to the irradiation the properties of the resist are locally changed, and further treatment of the resist results in the forming of a pattern on the wafer. Further processing, such as etching, evaporation of metals, implantation of materials, etc, may then be performed.

The known beam blanker is intended to blank/unblank a beam of electrons as used in such an Electron Beam Lithography System. It comprises a deflector formed by two electrodes and downstream of said deflector a diaphragm with an aperture. The diaphragm intercepts the beam of electrons when the beam is deflected by a deflector, and the aperture transmits the beam when the beam is not or hardly deflected. For a fast blank/unblank speed the diaphragm is positioned at a cross-over position of the beam. The small spot size of the beam at the cross-over enables an abrupt change in current for a small change in deflection, and thus a fast blank/unblank speed for a given dV/dt of the deflection signal. Further downstream of the deflector and the diaphragm a second deflector is placed so that the combined deflection of the two deflectors results in a pivot point at the cross-over. As a result of the pivot point coinciding with the cross-over no change of the position of the spot is observed downstream of the beam blanker when blanking the beam. Due to the limited speed of electrons in a beam the deflectors should be excited with a small time delay. This is achieved by exciting the deflectors with the same signal, but the signal of the second deflector is delayed by adding a delay line.

The voltage needed to blank the beam is typically 6 volts at a beam energy of approximately 20 keV.

According to the patent disclosure the known beam blanker can be used to frequencies of around 300 MHz.

Another application of a beam blanker is for generating a pulsed beam in a Transmission Electron Microscope (TEM). In a TEM a sample is irradiated by a beam of energetic electrons, and electrons transmitted through the sample are used to gather information about the sample. Normally the beam is used to study a sample that does not change in time, or only very little.

Lately there is a demand for studying effects that are time dependent, such as decay effects after probing the sample with a pulse of light, thereby pumping it to an excited state. By irradiating the sample with a train of electron pulses while also illuminating the sample with a time-synchronized train of light pulses from a pico- or femto-second laser, resulting in a train of light pulses with a duration similar to or shorter than the electron pulse, the decay effects can be studied. By introducing a variable phase delay between the two trains of pulses and making recordings for different phase delays, a complete dependency of the decay effects can be recorded. This resulted in the 1999 Nobel Prize for chemistry to professor Zewail for his work on femtochemistry, that is: the study of chemistry in the femtosecond scale by observing molecules with ultra-fast lasers.

It is noted that Zewail did not use a beam blanker to generate a pulsed electron beam, but a pulsed electron source, as described in US patent application No. US2005/0253069. The application describes that an electron source (a heated $LaB_6$ crystal) is pulsed by photo-emission of using a pulsed laser. A problem of a pulsed electron source of the type used by Zewail is that it shows a brightness that is much lower than the brightness of the well-known Schottky emitters routinely used in TEMs.

As known to the person skilled in the art the amplitude of the signal for driving a beam blanker is proportional to the energy of the beam blanked, while the period of the signal (and thus the dV/dt) is proportional with the frequency and/or rise time of the beam. At increasing frequencies the signal for driving the beam blanker must thus have a larger dV/dt. This is difficult to achieve. This is aggravated when the blanker is used for blanking a beam with higher energy, as this implies (using the same dimensions) a blanking signal with increased amplitude and increased dV/dt. It is noted that the 300 keV beam energy typically used in a TEM is more than 10 times higher than the 20 keV used in the beam blanker of the known patent.

There is a need for a high frequency beam blanker operating at a lower power and/or with a higher sensitivity.

The invention intends to provide such a beam blanker.

To that end the beam blanker according to the invention is characterized in that the electric field is generated by a resonant structure with a resonant frequency f, the resonant structure equipped to generate an electric field that sweeps the beam over the aperture, as a result of which the beam is transmitted through the aperture twice per period of the frequency f.

By making the deflection means part of a resonant structure, the amplitude of the deflector is amplified by a factor Q, in which Q is the quality factor of the resonant structure.

Such a resonant structure may include an LC network. In a preferred embodiment the deflector means consist of two electrodes that are part of a capacitor of an LC network.

Alternatively the deflector means are part of a wave guide, the wave guide coupled to a RF oscillator. The waveguide may be open or closed at one end. Small apertures in the waveguide allow the beam to enter and to leave the wave guide. The electric field in the waveguide deflects the beam.

In a preferred embodiment the resonant structure comprises a resonant transmission line (shielded or non-shielded). As is the case for a wave guide, the transmission line may be open ended or closed, as long as the beam passes near a voltage maximum of the transmission line.

It is noted that, as known to the person skilled in the art of RF electronics, when driving the resonant structure by a generator, impedance matching may be done by, for example, stub tuning with one or more opened or closed stubs. At lower frequencies for example tapped inductors and/or capacitors may be used, or for example a helical resonator that may or may not be combined with a capacitor.

It is noted that a beam blanker is described by K. Ura et al., "Picosecond Pulse Stroboscopic Scanning Electron Microscope", J. Electron Microsc., Vol. 27, No. 4, (1978), p. 247-252. This beam blanker uses a resonant cavity as shown in its FIG. $2^a$, and a buncher as shown in its FIG. $2^b$. The document mentions that the cavities are designed using Fujisawa's theory, see K. Fujisawa, "General Treatment of Klystron Resonant Cavities", IRE Trans. on Microwave Theory and Techniques (October 1958), pages 344-358. It is noted that the theory of Fujisawa only relates to (klystron) cavities with rotational symmetry, and thus the cavities of Hosokawa are rotational symmetric as well. Such cavities do not generate an electric field perpendicular to the rotational axis, as is the case in this invention.

In a preferred embodiment the beam blanker comprises a resonant transmission line and a grounded conductor, and the electric field is generated between the resonant transmission line and the grounded conductor.

The resonant transmission line may be open or closed at the end, and a voltage maximum (a voltage node) occurs at the position where the beam passes the transmission line.

The electric field may be synchronized to, or derived from, a driving signal. The driving signal may be an electric signal, or it may be an optical signal for triggering a photoreceptor, such as a PIN diode or a phototransistor, in an electric circuit.

Synchronizing the signal with an optical signal is especially attractive when synchronizing the signal to an optical probe signal that probes the sample in, for example, a TEM.

Synchronizing the signal with an optical signal is also very attractive when the beam blanker is situated in a high voltage area, such as the gun area of a TEM.

The deflection of the beam depends on the energy of the charged particles. In charged particle instruments the particles are often generated in a gun area and accelerated to their final energy The energy in the gun area is typically lower than 10 keV, while in a Transmission Electron Microscope the final energy with which they impact on a sample is typically between 80 and 400 keV, although higher and lower energies are known to be used. By placing the beam blanker in the gun area the deflection voltage (and thus the power needed to drive the beam blanker) is less than when the beam blanker is operated at the final energy. Preferably the driving of such a signal at high voltage (the gun voltage) is done using previously mentioned triggering by an optical signal, in which the optical signal bridges the gap between ground to high voltage via a fiber.

The resonant frequency f may be derived from a driving signal by injection locking, phase locking or frequency locking the resonant frequency to a, in most cases sub-harmonic, driving signal. Also frequency multiplication may be used to form a high frequency signal from a lower frequency signal.

Instead of driving the resonant structure with a driving signal, the resonant structure may comprise a negative impedance element, such as a Gunn diode or an IMPATT diode. In this way no external driving signal is necessary, as the negative impedance element will make the structure oscillate. It is noted that circuits are known in which the frequency of such a circuit can be tuned in a variety of ways, including mechanical means, electronic means (phase shifters) or injection locking.

For some uses it is necessary to tune frequency and/or phase of the resonant frequency f. This may be achieved by, for example, mechanical tuning means (e.g. a tuning screw), by electronic means (e.g. a phase shifter or a varicap), or in another way (such as the magnetic tuning used in RF isolators/circulators).

It is noted that the latter (the RF isolator/circulator) may also ease the demands on impedance matching to the resonant structure as little energy is reflected back into the circuitry generating the driving signal.

Instead of using a transmission line in the resonant circuit, also a cavity resonator may be used to generate the electric field. The cavity resonator may take the form of a TM or TE waveguide with two holes through which the beam enters and leaves the cavity resonator or waveguide.

Preferably the beam blanker is equipped with an aperture in the form of a slit or a hole with a dimension in the direction in which the beam is deflected of less than 100 µm, preferably less than 10 µm, most preferably less than 1 µm.

In a particle-optical instrument such as a Scanning Electron Microscope (SEM) or a Transmission Electron Microscope (TEM), or an instrument equipped with a SEM and/or a TEM column, the electron source is often a Schottky emitter. The Schottky emitter typically has an emitting diameter of approximately 20 nm, and a cross-over of less than 20 nm is formed by the condenser optics. An aperture of 100 µm, preferably less than 10 µm, and most preferably less than 1 µm can thus be well used to transmit the beam. It is noted that a smaller aperture implies that the beam is blanked at a lower electric field (a smaller deflection), but that too small an aperture implies problematic alignment. However, an alignment of less than 1 µm is well achievable.

The beam blanker is for use in a particle-optical instrument such as a Scanning Electron Microscope (SEM), a Transmission Electron Microscope (TEM) or a Focused Ion Beam (FIB) instrument, or an instrument equipped with a SEM, FIB and/or a TEM column.

Preferably the apparatus is equipped with a laser, such as a nano- or femtosecond laser, producing a train of light pulses for probing the sample. When synchronizing the laser and the beam blanker, time dependent studies on ultra-short (femtosecond) scale or longer can be performed.

The synchronization can be achieved by e.g. triggering the beam blanker by a laser pulse. Electrons then irradiate the sample shortly after the triggering took place. A variable phase shift in the beam blankers circuitry can then be used to probe the sample at different delay times.

For longer delay times two beam blankers can be used, one of the beam blankers selecting some of the pulses transmitted by the other. Preferably the two blankers show positional overlap, or even share components, such as the aperture.

As is clear to the person skilled in the art the signal of the beam blankers should be such that the beam passes through both blankers when required. This can be achieved by driving the beam blankers with the same frequency, but varying the phase of one (or both) signals with a phase shifting element. It is also possible to excite one beam blanker with a first frequency and the other with a frequency that has a harmonic or sub-harmonic relation to the first frequency. In that case a zero-crossing of both frequencies, and thus a passing of the beam through both beam blankers, occurs on a regular basis.

BRIEF DESCRIPTION OF THE DRAWINGS

The invention will be further described on the basis of figures, whereby identical reference numerals indicate corresponding elements. To that end.

DETAILED DESCRIPTION OF PREFERRED EMBODIMENTS

Figure 1:
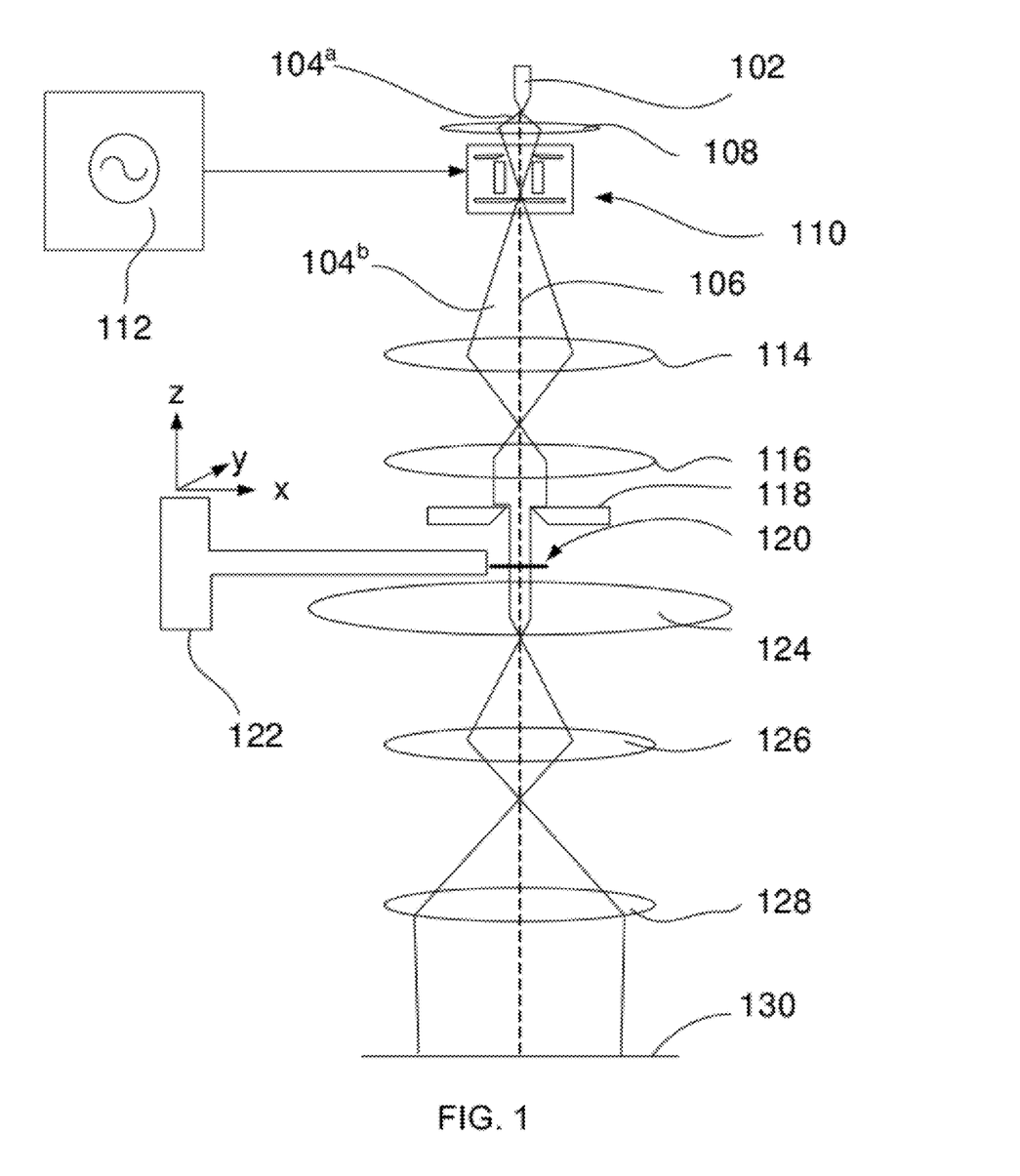
FIG. 1 schematically shows a TEM equipped with a beam blanker according to the invention, FIG. 2 schematically shows a SEM equipped with a beam blanker according to the invention, FIG. 3 schematically shows a beam blanker according to the invention, and FIG. 4 schematically shows the position of beam when deflected by two beam blankers.

FIG. 1 schematically shows a TEM equipped with a beam blanker according to the invention.

A source of charged particles in the form of electron source 102 emits a beam of electrons $104^a$ round electron-optical axis 106. An electron-optical lens 108, in the form of a magnetic or an electrostatic lens, focuses the beam in the beam blanker 110. A signal generator 112 is connected to the beam blanker to provide a driving signal to the beam blanker. The beam $104^b$ leaving the beam blanker enters two condenser lenses 114 and 116, and the opening angle of the beam is limited by beam limiting aperture 118. Thereafter the beam illuminates the electron transparent sample 120. The sample is mounted on a sample holder 122 that may shift or tilt the sample. The so-called objective lens 124 forms a first magnified image of the sample, that is further magnified by lenses 126 and 128 to form an image on image plane 130. The image plane may coincide with a fluorescent screen, a CCD camera or a CMOS camera, or it may coincide with the entrance plane of another type of detector.

It is noted that TEMs with more condenser lenses, and/or more imaging lenses are known. Furthermore a TEM also comprises dipoles for aligning the beam, and may comprise multipoles for correcting e.g. lens errors. Other detectors, for example detectors for detecting radiation from the sample in the form of back-scattered electrons, secondary electrons, X-rays, etc. may be used. The energy loss of electrons transmitted through the sample may be determined.

The source of particles typically used in a TEM is a Schottky source, although other sources, such as thermionic sources comprising a crystal of e.g. $LaB_6$ or $CeB_6$ are also known to be used, as well as field-emission sources. The electrons emitted by such a source are accelerated to an energy of typically between 50 keV and 500 keV before impinging on the sample, although lower and higher energies are known to be used. The sample is a very thin sample, ranging from from a thickness of less than 30 nm when the sample comprises high-Z materials, such as semiconductor samples, to samples of 1 μm when the sample comprises mainly low-Z materials, as is the case for biological and e.g. polymer samples. Because the sample is so thin, and the electrons are so highly energetic, the sample is transparent to the electrons. However, there is interaction between the electrons and the sample, as a result of which electrons may be scattered, or absorbed. Scattering of the electrons may be detected by constructive/destructive interference of the scattered electrons with non-scattered electrons on image plane 130. Absorption of electrons may likewise be imaged on the enlarged image plane. In this manner images can nowadays be made with atomic resolution (less than 0.1 nm) and a magnification of more than 1,000,000 times.

Normally images are obtained of a sample that does not, or hardly, change during the imaging. In most cases it is even detrimental when sample change (either in appearance or in position) during the imaging. However, some studies comprise the time dependent imaging of samples that are probed by e.g. a laser pulse. Such studies may address for example solidification studies of a sample, or the decay of excited states. Essential herein is synchronization between the bunching of the beam blanker and the probing of the sample with e.g. the laser pulse.

By using the beam blanker many bunches of electrons are leaving the beam blanker, and thus the sample is illuminated by regularly repeated bunches of electrons. Even when one bunch of electrons does not contain sufficient electrons to form an image with sufficient quality (for example signal-to-noise ratio), repetition of bunches with a constant time delay between laser pulse and electron bunch may result in an image with sufficient quality. By slightly changing the time delay a series of images corresponding to different time delays can be formed.

It is noted that the use of a Schottky-emitted electron source or the use of a field-emitter electron source results in an electron source with a much higher brightness than the electron source used by Zewail (thermionic $LaB_6$ crystal with pulsed laser photo-emission).

It is further mentioned that the electrons can be accelerated to their final energy (the energy with which they impinge on the sample) before traveling through the beam blanker or after traveling through the beam blanker.

Figure 2:
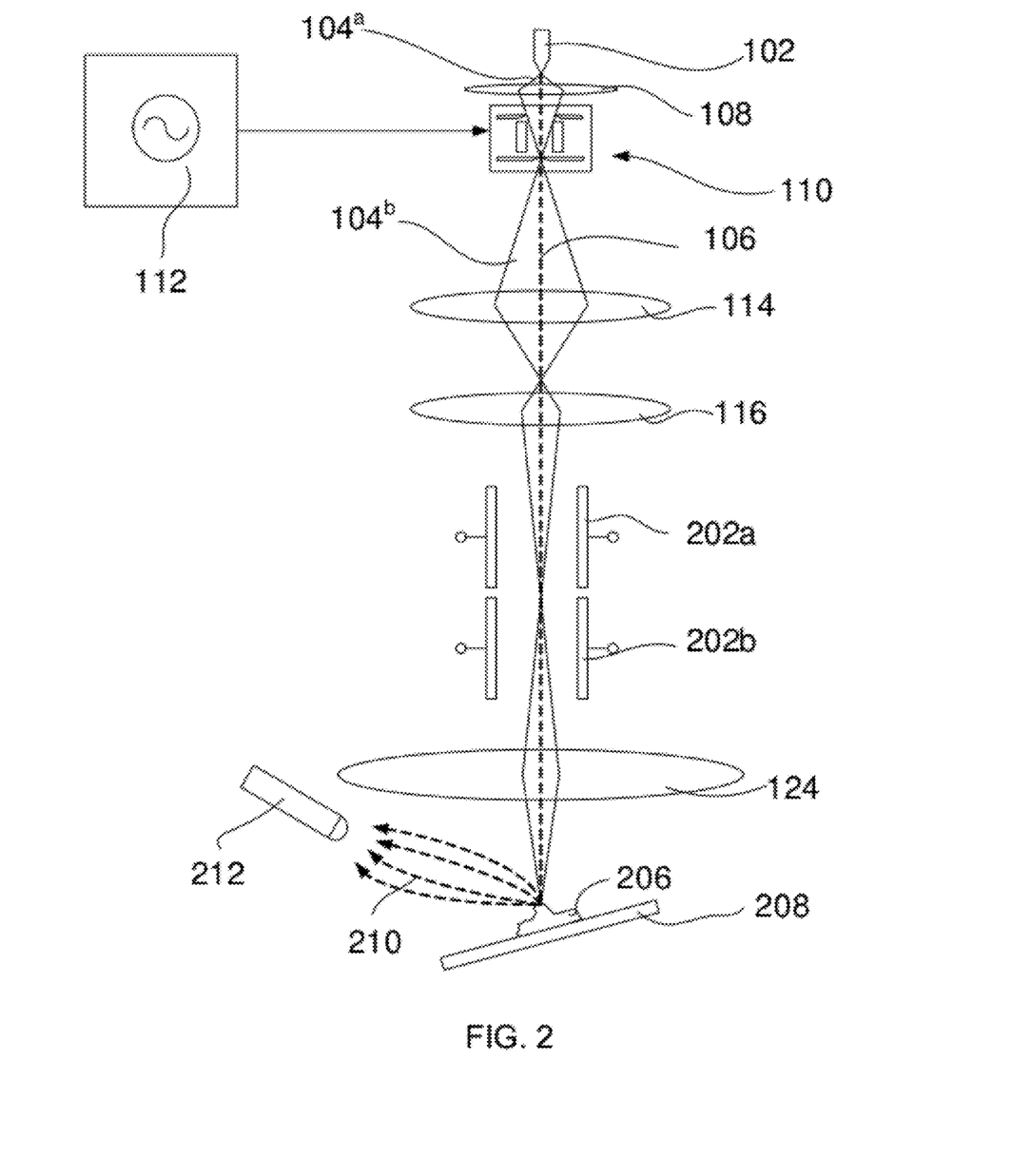

FIG. 2 schematically shows a Scanning Electron Microscope equipped with a beam blanker according to the invention.

FIG. 2 shows an electron source 102 emitting an electron beam $104^a$ round an electron-optical axis 106. An electron-optical lens 108, in the form of a magnetic or an electrostatic lens, focuses the beam in the beam blanker 110. A signal generator 112 is connected to the beam blanker to provide a driving signal to the beam blanker. Objective lens 202 focuses beam $104^b$ coming out of the beam blanker on the sample 204. The beam is scanned over the sample by deflectors $206^a$ and $206^b$. The sample is mounted on a stage 208 that may shift or tilt the sample. The electrons impinging on the sample cause secondary radiation 210, such as backscattered electrons, secondary electrons, photons, X-rays, etc. Such secondary radiation may be detected by detector 212.

It is worth mentioning that also detectors are known that detect radiation that re-enters the objective lens. In that case the detector is typically situated between the objective lens and the condenser lens 116.

It is noted that similar instruments are known in which, instead of electrons, ions are used as charged particles.

It is further noted that scanning of a focused beam over the sample is also known in Scanning Transmission Electron Microscopes (STEMs). Such STEMs are often equipped to work as a TEM as well.

Figure 3:
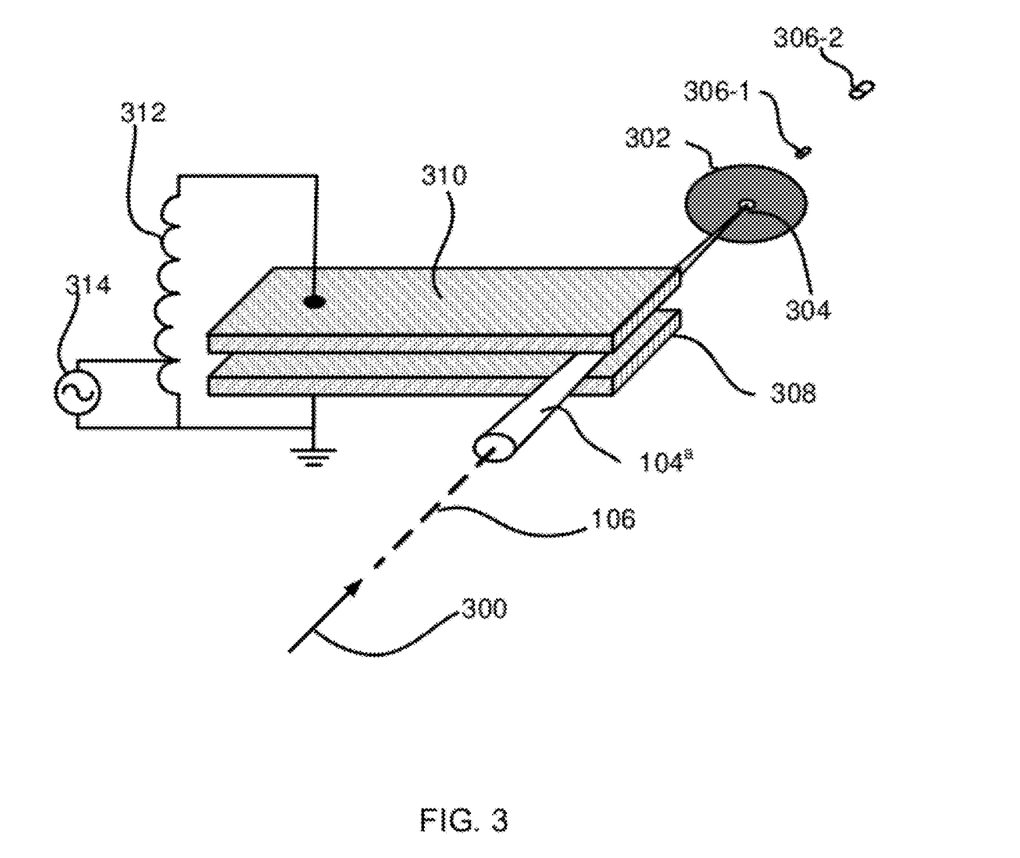

FIG. 3 schematically shows a beam blanker 100 according to the invention.

The beam blanker comprises two deflector electrodes 308 and 310 for generating an electric field. The incoming beam of particles $104^a$, propagating along axis 300, passes through the aperture 304 in diaphragm 302 when not deflected. When deflected, the beam is intercepted by the diaphragm. Electrically the electrodes 308 and 310 form a capacitor that is in parallel to inductor 312, thus forming a resonant circuit. The inductor is a tapped inductor, and thus the amplitude of signal generator 314 is greatly magnified. As a result bunches of charged particles 306-$i$ leave the beam blanker.

In this figure the resonant circuit is shown as a LC circuit, with lumped components. For high blanking frequencies, for example frequencies in excess of 1 GHz, more specifically in excess of 10 GHz, resulting in bunch length of 1 ps or less, the use of transmission lines is more appropriate. As known to the person skilled in the art of RF electronics, a transmission line that is not terminated with its characteristic impedance can be a resonant transmission line where at one or more positions on the transmission line the voltage of a signal fed to the transmission line shows a maximum, for example at λ/4 from the end of a shorted transmission line, with λ the wave length of the electric signal. For transmission lines that are open at the end, the maximum occurs at the end and, for example, at λ/2 from the end. By passing the beam near such a maximum, high deflection is achieved with low driving power of the transmission line. Tuning may be done with one or more stub tuners. It is noted that a structure that is tuned at a frequency f, often is also tuned at either odd or even harmonics of said frequency.

It is mentioned that, assuming a voltage maximum occurs at given location on the transmission line, also positions removed much less than λ/4 from said position can be used to generate the electric field. It is thus sufficient when the beam passes, for example, within 1/10, more preferably 1/20, of a wavelength of a voltage maximum. A position close to an open-ended transmission line is thus suited. At a resonant frequency of approximately 25 GHz a wavelength corresponds with approximately 1 cm, and thus positional accuracies of approximately 1 mm are needed.

It is noted that preferably the length of the beam blanker, that is: the dimension in the direction of the propagation direction of the beam, is small, so that the lingering period of the charged particles in the beam blanker is small compared to the bunch length. A preferred embodiment of the beam blanker has a length in the direction in which the beam propagates such that a particle of the beam resides in the electric field less than 1/10 of a period of the resonant frequency, more preferably less than 1/100 of a period of the resonant frequency.

By using two beam blankers, one after the other, a number of bunches 306-i can be removed from the train of bunches: a charged particles passes through the two beam blankers when it experiences no deflection at both blankers, and is blocked when it experiences a deflection at either blanker.

Reduction of the number of pulses can be desired for studying longer lasting phenomena, for phenomena in which it is desired that the sample returns to its ground state, or in cases where heating by the electron beam is a problem.

Control can be realized by feeding a signal with the same frequency to both blankers, but shifting the phase of the signal fed to one of the blankers, for example using an electronically controlled phase shifter as commercially available, or a phase shifting element such as a varicap.

Another way of control is by feeding a signal having a harmonic or sub-harmonic relation of the signals fed to the two blankers, resulting in an eye-pattern that crosses the origin.

It is noted that, as the traveling speed of the particles is limited, a proper delay time between the two beamblankers should be included.

It is noted that skipping a number of pulses may look identical to lowering the resonant frequency f to a sub-harmonic. However, using a lower resonant frequency will normally also result in a longer pulse length, as—assuming the same amplitude for the electric field—the beam takes longer to pass over the aperture. The use of a lower resonant frequency may thus result in a degradation of time resolution.

Figure 4:
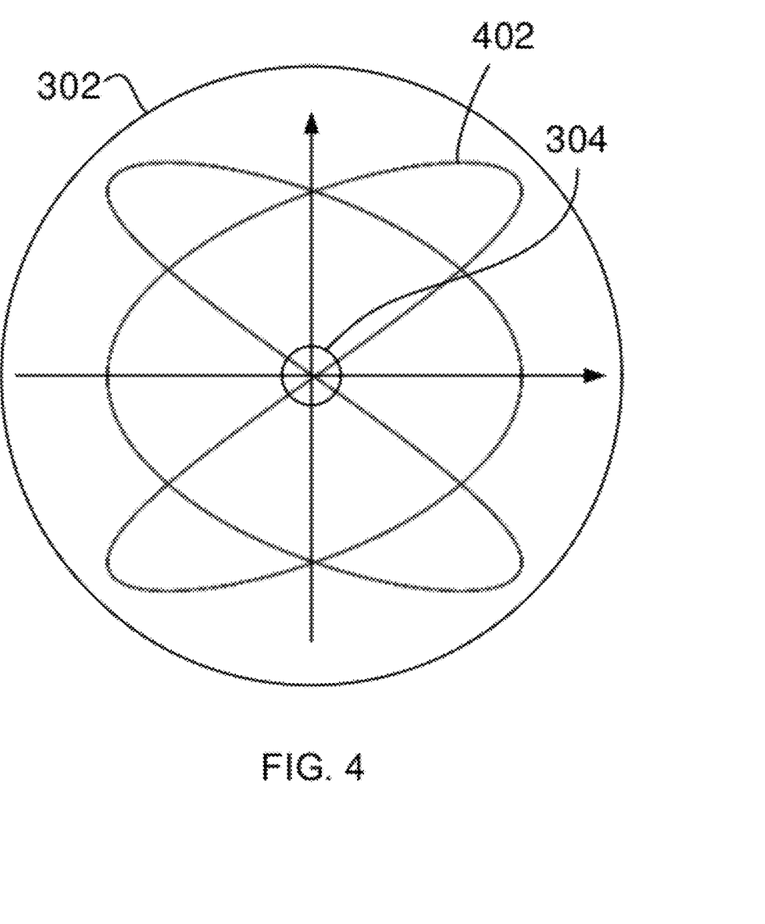

FIG. 4 schematically shows the beam position of the beam on the diaphragm 302 when using two blankers and signals with harmonic relation.

Assuming the beam blankers deflect the beam 104$^a$ in two perpendicular directions, the beam will be deflected or scanned over the diaphragm in a Lissajous-figure 402 as shown in FIG. 4. Only when the beam is over the aperture 304 the beam passes through the aperture, otherwise it is blocked by diaphragm 302.

It is noted that a proper delay time between the two beam blankers should be included to correct for the traveling time of the particles between the two blankers.

It is further noted that the beam blankers may share components, such as the diaphragm 302.

In a Transmission Electron Microscope (TEM) the beam of charged particles is produced at an energy of, for example, 5 keV and then accelerated to an energy of typically between 50 keV and 500 keV. For an identical behavior of the blanker the voltage on the blanker should be proportional to the energy of the charged particles (the electrons). A much lower voltage can thus be used when blanking the beam before it is accelerated to its final energy. In such a case the synchronization of the beam blanker to for example a laser probing the sample is preferably done by sending (a derivative of the) light pulses synchronized with the laser via an optical path to photo-receptors at high-voltage. These photo-receptors can then be part of the electronics that drive the blanker or blankers.

It is noted that, as a result of the lower power needed for a resonant structure, electrical interference, both internal to the instrument and external to the instrument, are smaller. This makes this type of beam blanker well suited for generating pulses with a repetition frequency of, for example, between 10 GHz and 100 GHz, and pulses with a duration of 10 ps or less. When used in a transmission electron microscope equipped with a high-brightness electron source, for example a Schottky emitter, such a blanker is suited for the study of chemistry on the picoseconds timescale.

We claim as follows:

1. Beam blanker for interrupting a beam of charged particles, the beam blanker having an axis along which charged particles propagate before entering the beam blanker, the beam blanker comprising means for generating an electric field perpendicular to said axis, the electric field for deflecting the charged particles, and an aperture in a diaphragm, the aperture transmitting the beam when the beam is not interrupted and the diaphragm stopping the beam when the beam is interrupted, characterized in that the electric field is generated by a resonant structure with a resonant frequency f, the resonant structure equipped to generate an electric field that sweeps the beam over the aperture, the resonant structure comprising a resonant transmission line and a grounded conductor, the electric field generated between the two resonant transmission line and the grounded conductor, as a result of which the beam is transmitted through the aperture twice per period of the frequency f.

2. Beam blanker for interrupting a beam of charged particles, the beam blanker having an axis along which charged particles propagate before entering the beam blanker, the beam blanker comprising means for generating an electric field perpendicular to said axis, the electric field for deflecting the charged particles, and an aperture in a diaphragm, the aperture transmitting the beam when the beam is not interrupted and the diaphragm stopping the beam when the beam is interrupted, characterized in that the electric field is generated by a resonant structure with a resonant frequency f, the resonant structure equipped to generate an electric field that sweeps the beam over the aperture, the resonant structure excited by a signal supplied by an electrical circuit comprising a photoreceptor, as a result of which the beam is transmitted through the aperture twice per period of the frequency f.

3. Beam blanker for interrupting a beam of charged particles, the beam blanker having an axis along which charged particles propagate before entering the beam blanker, the beam blanker comprising means for generating an electric field perpendicular to said axis, the electric field for deflecting the charged particles, and an aperture in a diaphragm, the aperture transmitting the beam when the beam is not interrupted and the diaphragm stopping the beam when the beam is interrupted, characterized in that the electric field is generated by a resonant structure with a resonant frequency f, the resonant structure equipped to generate an electric field that sweeps the beam over the aperture, the aperture comprising a slit or a hole with a dimension in the direction in which the beam is deflected of less than 10 µm, as a result of which the beam is transmitted through the aperture twice per period of the frequency f.

4. The beam blanker according to claim 3 in which the resonant frequency f is injection locked, phase locked, or frequency locked to a driving signal, or derived from the driving signal by frequency multiplication.

5. The beam blanker according to claim 3 in which the resonant structure compring an element for tuning the resonant frequency f or shifting the phase of the resonant frequency f.

6. The beam blanker according to claim 3 in which the electric field is generated in a cavity resonator.

7. The beam blanker according to claim 3 equipped to be used in an apparatus with a beam of charged particles in which, in working, the electric field in the direction in which the particles of beam propagate has a length such that the particles traverse the electric field in a time less than 1/10 of a period of the resonant frequency.

8. Particle-optical apparatus comprising a particle source for producing charged particles, one or more charged particle lenses, and a sample position for mounting a sample, the particle-optical apparatus equipped with the beam blanker of claim 3.

9. The particle-optical apparatus of claim 8 further comprising a pulsed laser for producing a train of optical pulses for optically exciting a sample at the sample position, the train of optical pulses synchronized to the resonant frequency f.

10. Beam blanker for interrupting a beam of charged particles, the beam blanker having an axis along which charged particles propagate before entering the beam blanker, the beam blanker comprising means for generating an electric field perpendicular to said axis, the electric field for deflecting the charged particles, and an aperture in a diaphragm, the aperture transmitting the beam when the beam is not interrupted and the diaphragm stopping the beam when the beam is interrupted, characterized in that the electric field is generated by a resonant structure with a resonant frequency f, the resonant structure equipped to generate an electric field that sweeps the beam over the aperture, the resonant structure comprising a negative resistance element, as a result of which the beam is transmitted through the aperture twice per period of the frequency f.

11. Particle-optical apparatus comprising a particle source for producing charged particles, one or more charged particle lenses, and a sample position of mounting a sample, the particle-optical apparatus equipped with:
a beam blanker for interrupting a beam of charged particles, the beam blanker having an axis along which charged particles propagate before entering the beam blanker, the beam blanker comprising means for generating an electric field perpendicular to said axis, the electric field for deflecting the charged particles, and an aperture in a diaphragm, the aperture transmitting the beam when the beam is not interrupted and the diaphragm stopping the beam when the beam is interrupted, characterized in that the electric field is generated by a resonant structure with a resonant frequency f, the resonant structure equipped to generate an electric field that sweeps the beam over the aperture, the aperture comprising a slit or a hole with a dimension in the direction in which the beam is deflected of less than 10 µm, as a result of which the beam is transmitted through the aperture twice per period of the frequency f,
the beam blanker positioned such that the beam enters the beam blanker with an energy lower than the energy with which the beam impinges on the sample.

12. The particle-optical apparatus of claim 8 in which the beam blanker producing bunches of charged particles, and the apparatus comprises a second beam blanker that in a period of time selectively transmits one or more bunches of charged particles and blocks one or more other bunches of charged particles.

13. Particle-optical apparatus comprising a particle source for producing charged particles, one or more charged particle lenses, and a sample position of mounting a sample, the particle-optical apparatus equipped with:
a beam blanker for interrupting a beam of charged particles, the beam blanker having an axis along which charged particles propagate before entering the beam blanker, the beam blanker comprising means for generating an electric field perpendicular to said axis, the electric field for deflecting the charged particles, and an aperture in a diaphragm, the aperture transmitting the beam when the beam is not interrupted and the diaphragm stopping the beam when the beam is interrupted, characterized in that the electric field is generated by a resonant structure with a resonant frequency f, the resonant structure equipped to generate an electric field that sweeps the beam over the aperture, the aperture comprising a slit or a hole with a dimension in the direction in which the beam is deflected of less than 10 µm, as a result of which the beam is transmitted through the aperture twice per period of the frequency f,
the beam blanker producing bunches of charged particles, and the apparatus comprising a second beam blanker that in a period of time selectively transmits one or more bunches of charged particles and blocks one or more other bunches of charged particles,
the beam blanker and the second beam blanker showing positional overlap and/or sharing components.

14. A particle-optical apparatus having an optical axis along which a beam of the charged particles travel, comprising:
a particle source for producing charged particles;
one or more charged particle lenses;
a beam blanker for interrupting the beam of charged particles, including:
a resonator for generating an electric field perpendicular to said axis, the electric field for deflecting the charged particles, and
an aperture in a diaphragm, the aperture transmitting the beam when the beam is not interrupted and the diaphragm stopping the beam when the beam is interrupted,
the resonant structure comprising a resonant transmission line and a grounded conductor, the electric field generated between the two resonant transmission line and the grounded conductor,
the resonator having a resonant frequency f and equipped to generate an electric field that sweeps the beam across a line that is in the place of the aperture, that intersects the aperture, and that is perpendicular to the direction of deflection, and as a result, the beam crosses the line twice per period of the frequency f; and a sample position for mounting a sample in the particle optical apparatus.

15. The particle optical apparatus of claim 14 further comprising a second beam blanker -along the optical axis, the second beam blanker generating a second electric field perpendicular to the first electric field.

16. A particle optical apparatus having an optical axis along which a beam of the charged particles travel, comprising:
   a particle source for producing charged particles;
   one or more charged particle lenses;
   a beam blanker for interrupting the beam of charged particles, including:
      a resonator for generating an electric field perpendicular to said axis, the electric field for deflecting the charged particles, and
      an aperture in a diaphragm, the aperture transmitting the beam when the beam is not interrupted and the diaphragm stopping the beam when the beam is interrupted,
      the resonator having a resonant frequency f and equipped to generate an electric field that sweeps the beam across a line that is in the place of the aperture, that intersects the aperture, and that is perpendicular to the direction of deflection, and as a result, the beam crosses the line twice per period of the frequency f;
   a sample position for mounting a sample in the particle optical apparatus; and
   a second beam blanker along the optical axis, the second beam blanker generating a second electric field perpendicular to the first electric field, the second beam blanker sharing an aperture with the first beam blanker.

17. The particle optical apparatus of claim 14 in which the electric field sweeps the beam over the aperture twice per period, as a result of which the beam is transmitted through the aperture twice per period of the frequency f.

18. A particle-optical apparatus having an optical axis along which a beam of the charged particles travel, comprising:
   a particle source for producing charged particles;
   one or more charged particle lenses;
   a beam blanker for interrupting the beam of charged particles, including:
      a resonator for generating an electric field perpendicular to said axis, the electric field for deflecting the charged particles, and
      an aperture in a diaphragm, the aperture transmitting the beam when the beam is not interrupted and the diaphragm stopping the beam when the beam is interrupted,
      the resonator having a resonant frequency f and equipped to generate an electric field that sweeps the beam across a line that is in the place of the aperture, that intersects the aperture, and that is perpendicular to the direction of deflection, and as a result, the beam crosses the line twice per period of the frequency f, the resonant structure is excited by a signal supplied by an electrical circuit comprising a photoreceptor; and
   a sample position for mounting a sample in the particle optical apparatus.

19. The beam blanker according to claim 14 in which the resonant frequency f is injection locked, phase locked, or frequency locked to a driving signal, or derived from the driving signal by frequency multiplication.

20. A method of rapidly blanking a beam in a particle optical apparatus having a beam blanker including a deflector and an aperture, the beam blanker positioned along a system optical axis, comprising:
   providing a charged particle beam along the optical axis;
   providing a deflection signal from a resonator at its resonant frequency to generate an electric field perpendicular to the optical axis, the resonant structure comprising a resonant transmission line and a grounded conductor, the electric field generated between the two resonant transmission line and the grounded conductor, the resonator having a resonant frequency f and generating an electric field that sweeps the beam across a line that is in the plane of an aperture, that intersects the aperture, and that is perpendicular to the direction of deflection, and as a result, the beam crosses the line twice per period of the frequency f, the beam periodically crossing the aperture and being transmitted to a sample;
   periodically impinging the beam onto a work piece.

21. The method of claim 20 in which providing a deflection signal includes providing a deflection signal that sweeps the beam over the aperture twice per period, as a result of which the beam is transmitted through the aperture twice per period of the frequency f.

22. The beam blanker according to claim 3 in which the aperture is a slit or a hole with a dimension in the direction in which the beam is deflected of less than 1 μm.

23. The beam blanker according to claim 3 equipped to be used in an apparatus with a beam of charged particles in which, in working, the electric field in the direction in which the particles of beam propagate has a length such that the particles traverse the electric field in a time less than $1/100$ of a period of the resonant frequency.

* * * * *